United States Patent
Ang et al.

(10) Patent No.: US 9,911,633 B2
(45) Date of Patent: Mar. 6, 2018

(54) SEMICONDUCTOR PROCESSING BOAT DESIGN WITH PRESSURE SENSOR

(71) Applicant: Taiwan Semiconductor Manufacturing Company, Ltd., Hsin-Chu (TW)

(72) Inventors: Ai-Tee Ang, Hsin-Chu (TW); Hsiu-Jen Lin, Zhubei (TW); Wei-Hung Lin, Xinfeng Township (TW); Ming-Da Cheng, Jhubei (TW); Chung-Shi Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/238,503

(22) Filed: Aug. 16, 2016

(65) Prior Publication Data
US 2016/0358797 A1 Dec. 8, 2016

Related U.S. Application Data

(62) Division of application No. 14/159,106, filed on Jan. 20, 2014, now Pat. No. 9,427,818.

(51) Int. Cl.
| | |
|---|---|
| *H01L 21/31* | (2006.01) |
| *H01L 21/469* | (2006.01) |
| *H01L 21/673* | (2006.01) |
| *B23K 1/00* | (2006.01) |
| *B23K 3/08* | (2006.01) |
| *H01L 21/67* | (2006.01) |
| *H01L 21/68* | (2006.01) |

(52) U.S. Cl.
CPC ...... *H01L 21/67313* (2013.01); *B23K 1/0016* (2013.01); *B23K 3/087* (2013.01); *H01L 21/67253* (2013.01); *H01L 21/68* (2013.01)

(58) Field of Classification Search
CPC . B23K 1/0016; B23K 3/087; H01L 21/67386; H01L 21/67313; H01L 21/67356; H01L 2221/683
See application file for complete search history.

(56) References Cited

U.S. PATENT DOCUMENTS

| | | | | |
|---|---|---|---|---|
| 5,164,905 | A * | 11/1992 | Iwasaki | G06Q 10/087 414/935 |
| 6,049,656 | A * | 4/2000 | Kim | B23K 1/005 219/85.12 |
| 8,104,666 | B1 * | 1/2012 | Hwang | B23K 1/0012 228/180.22 |

(Continued)

FOREIGN PATENT DOCUMENTS

TW 201115675 A1 5/2011

*Primary Examiner* — Victor A Mandala
(74) *Attorney, Agent, or Firm* — Slater Matsil, LLP

(57) ABSTRACT

Presented herein is a device processing boat comprising a base and at least one unit retainer disposed in the base. The device further comprises a cover having at least one recess configured to accept and retain at least one unit. The at least one recess is aligned over, and configured to hold the at least one unit over, at least a portion of the at least one unit retainer. The cover is retained to the device processing boat by the at least one unit retainer. At least one pressure sensor having at least one sensel is disposed in the base. The sensel is configured to sense a clamping force applied by the cover to the at least one unit.

20 Claims, 9 Drawing Sheets

(56) References Cited

U.S. PATENT DOCUMENTS

| | | | |
|---|---|---|---|
| 2003/0165602 A1* | 9/2003 | Garwood | A23B 4/16 426/392 |
| 2005/0032469 A1* | 2/2005 | Duescher | B24D 11/001 451/548 |
| 2006/0043600 A1* | 3/2006 | Onodera | H01L 21/67336 257/774 |
| 2006/0239799 A1 | 10/2006 | Jang et al. | |
| 2007/0107523 A1* | 5/2007 | Galewski | G01L 9/0052 73/754 |
| 2009/0252488 A1* | 10/2009 | Eromaki | G02B 7/102 396/529 |
| 2009/0318062 A1* | 12/2009 | Chiu | B24B 37/20 451/8 |
| 2011/0030152 A1* | 2/2011 | Watanabe | G02C 7/12 8/495 |
| 2011/0062053 A1 | 3/2011 | Vo et al. | |
| 2014/0043123 A1* | 2/2014 | Lee | B23Q 3/1543 335/285 |
| 2014/0312576 A1* | 10/2014 | Bedell | B25B 11/005 279/3 |

* cited by examiner

SEMICONDUCTOR PROCESSING BOAT DESIGN WITH PRESSURE SENSOR

CROSS-REFERENCE TO RELATED APPLICATIONS

This application is a divisional of U.S. application Ser. No. 14/159,106, filed on 20 Jan. 2014, entitled "Semiconductor Processing Boat Design with Pressure Sensor," which application is hereby incorporated by reference.

BACKGROUND

Semiconductor devices are used in a variety of electronic applications, such as, for example, personal computers, cell phones, digital cameras, and other electronic equipment. The semiconductor industry continues to improve the integration density of various electronic components (e.g., transistors, diodes, resistors, capacitors, etc.) by continual reductions in minimum feature size, which allow more components to be integrated into a given area. In some devices, multiple dies are stacked vertically to reduce the footprint of a device package and permit dies with different processing technologies to be interconnected. The vertically stacked devices are electrically connected to each other to provide signal communication between devices, and the electrical connections may be formed from solder, wire bonds, lands, vias, pillars, studs, or the like.

In some devices, multiple devices may be joined during processing of the devices to permit rapid throughput of the packages and to take advantage of the processing capabilities of the fabrication equipment. Dies, packages, chips, devices, or the like maybe stacked in precise alignment and subsequently electrically connected to each other.

BRIEF DESCRIPTION OF THE DRAWINGS

Aspects of the present disclosure are best understood from the following detailed description when read with the accompanying figures. Corresponding numerals and symbols in the different figures generally refer to corresponding parts unless otherwise indicated. The figures are drawn to illustrate the relevant aspects of the embodiments and it should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
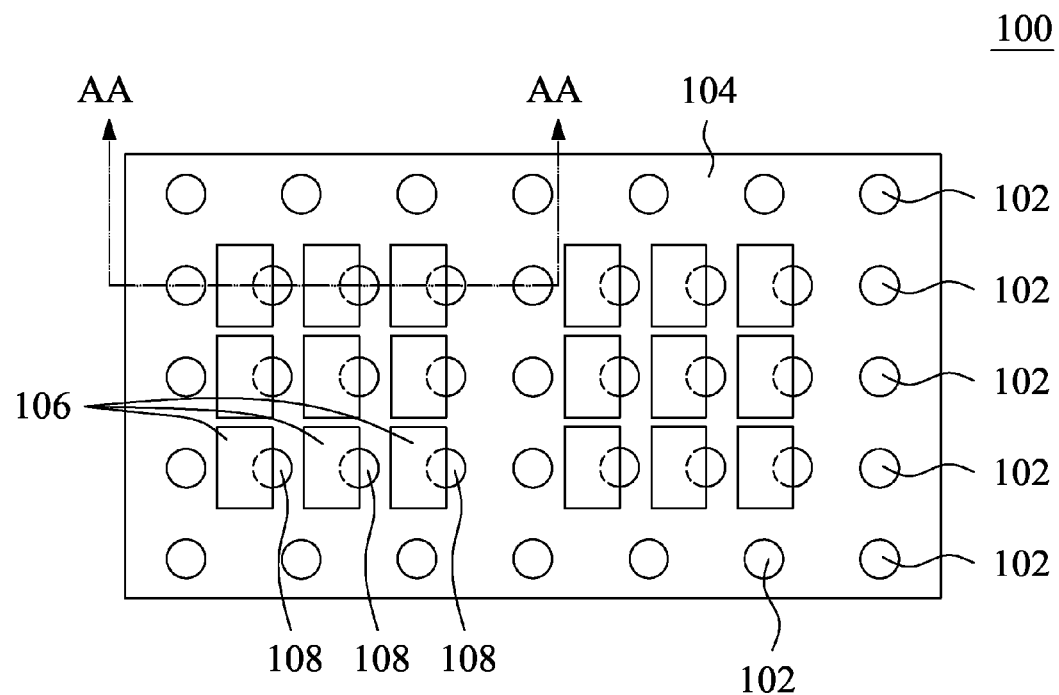
FIGS. 1A-1C and 2A-2B are top views and cross-sectional views illustrating a boat with retainers in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Units such as dies, chips, substrates, or other structures used in semiconductor production may be processed in controlled environments by subjecting the units to processing variables that may cause physical changes or deformations in the unit. In some instances, back-end-of-line processing may be used to mount a package, die, device, or other structure on a unit using solder balls or other heat activated connecting material, or by wire bonding, welding, or the like. In some embodiments, solder is reflowed by heating the unit and package to melt the solder connection before permitting the solder to solidify and form a solid connection between the unit and the package.

In order to precisely align the unit and package before and during reflow, the units are aligned on a boat, and a cover is placed over the units to maintain the units in a predetermined location before and during reflow. As described in greater detail below, the cover is retained to the boat with one or more retainers, and packages are mounted to the units through openings in the cover. The pressure at which the units are held to the boat may be measured using pressure sensors on the boat to verify that a unit maintained a desired shape and location before, during and after reflow or heat treating.

Figure 1B:
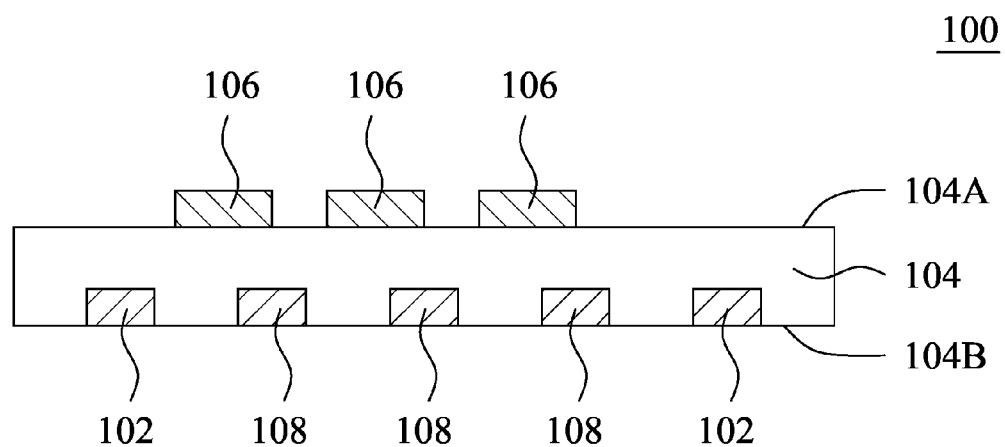
Figure 1C:
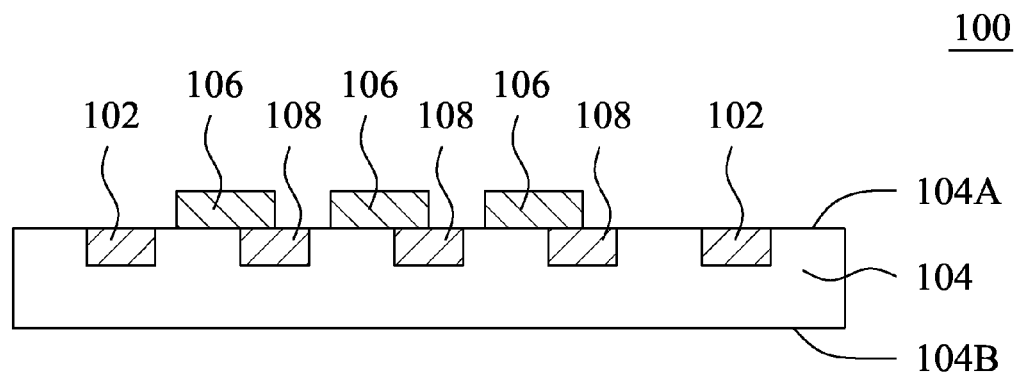

FIG. 1A is a top view of a device processing boat 100 with retainers 102, 108 according to some embodiments. FIGS. 1B and 1C are cross-sectional views of the boat 100 showing the retainers 102, 108 in the base 104 according to some embodiments. The boat 100 has a base 104 with border retainers 102 around the edge of the base 104. The base 104 is a substrate, platform or surface for holding a unit during processing. In some embodiments, the base 104 is a wafer, substrate, glass carrier, ceramic, or the like.

The border retainers 102 are arranged around or bordering an interior region where the units 106 are located during processing. Unit retainers 108 are arranged in the interior regions of the boat 100 and are inside the border retainers 102. The unit retainers 108 and the border retainers 102 are, in some embodiments, magnets embedded in the base 104. The use of a magnet for the retainers 102, 108 permits a cover (see, e.g., FIGS. 4-5 and 6A-6B) to be placed over the boat 100 to hold the units 106 flat on the top surface of the base 104 during processing. The units 106 are also retained in unit areas of the base 104 by the cover so that the units 106 are in a known and predetermined position in relation to the boat 100, and subsequent processing is more precise. It should be noted that the retainers 102, 108 are not limited solely to being formed from a magnet. In other embodiments the retainers 102, 108 may be clips, adhesives, snaps or another structure that holds the cover securely to the base.

In an embodiment, the unit retainers 108 are disposed in the base 104 and touch or extend into, the regions where the units 106 are placed. Thus, when the units are aligned and placed on the boat 100, each unit 106 has at least one unit retainer 108 under the unit 106.

In an embodiment where the unit retainers 108 are magnets, the unit retainers 108 have portions extending from under the units 106 past the edges of the units 106. In some embodiments, at least a portion of each of the unit retainers 108 is uncovered by the units 106. This permits the cover to align over a part of the unit retainer 108 without the unit interfering or coming between the unit retainer 108 and cover. This results in greater clamping force on the individual units 106 to prevent warping or deformation of the units 106 during processing. In other embodiments, the units 106 may be part of a continuous workpiece, such as a wafer or strip of units, or the unit 106 may be a larger structure spanning more than one unit retainer 108. In such embodiments, the unit retainers 108 may be completely disposed under the unit 106 or workpiece.

In some embodiments, the magnets for the unit retainer 108 are rare earth magnets such as samarium cobalt (SmCo), neodymium iron boron (NdFeB) or the like, ceramic magnets such as strontium ferrite (SrFe), alnico magnets, or other magnetic materials that can withstand the heat and environmental conditions associated with processing the units 106. Additionally, the magnets will be powerful enough to retain the cover against the surface of the base 104 and unit retainers 108 during processing to prevent warping or deformation of the units 106. The magnetic field strength required by the magnets used for the unit retainers 108 varies based on the area of the unit retainers 108 disposed underneath the units 106, and the thickness and magnetic permittivity of the units. The magnetic field of the unit retainer 108 attracts the cover through the units 106, however, the presence of the unit 106 may attenuate the magnetic field passing through the unit 106.

FIG. 1B is a cross-sectional view showing an embodiment of the section AA in FIG. 1A. In such an embodiment, the unit retainers 108 and border retainers 102 are embedded underneath the top surface of the base 104A. In an embodiment, the retainers 102 and 108 in this embodiment are exposed at the bottom surface of the boat, however, the placement of the retainers 102 and 108 is not limited to such location. For example, in some embodiments, the retainers 102 and 108 are disposed in the center of the base 104 so that they are between but spaced apart from both the top base surface 104A and the bottom surface 104B of the base 104.

FIG. 1C is a cross-sectional view showing another embodiment of the section AA in FIG. 1A. In such an embedment, the unit retainers 108 and border retainers 102 are embedded in the base 104 and have a surface exposed at the top surface of the base 104A.

Figure 2A:
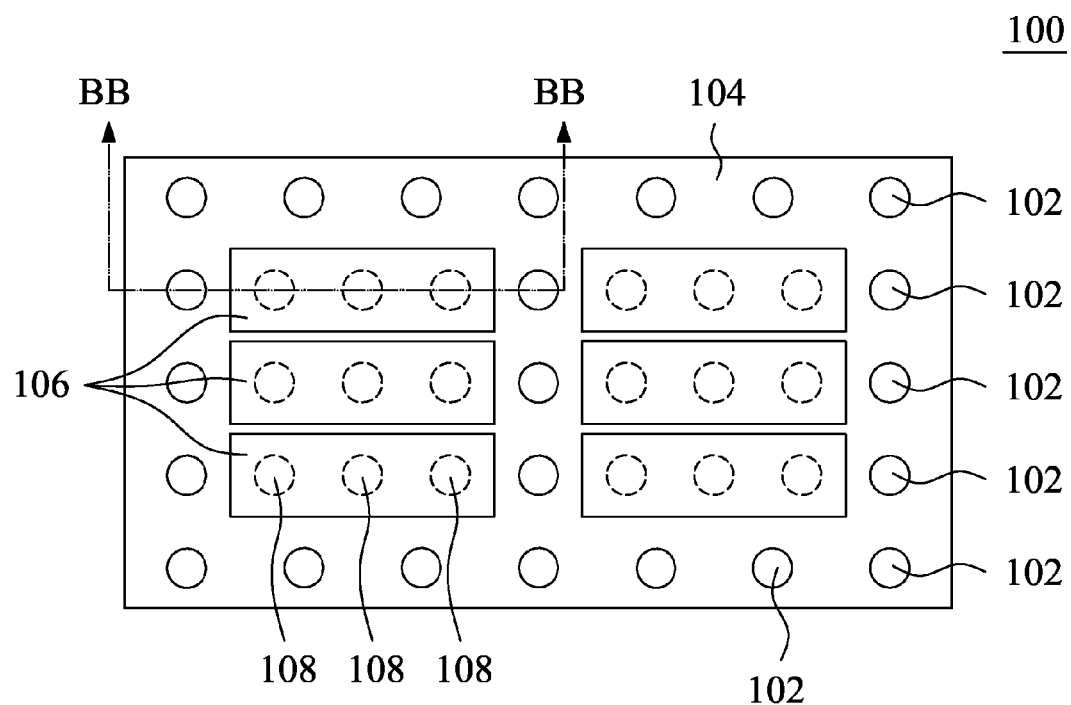

FIG. 2A is a top view diagram illustrating a boat 100 with units 106 formed as strips according to some embodiments. It should be understood that the boat 100 disclosed herein is not limited to handling individual singulated units 106, but may also accept any package form that permits the cover to be attached with a magnet may be used. For example, the units 106 may be singulated, or may be formed as multiple or single units 106 in a strip or as units 106 disposed on a single workpiece 302, or in a grid arrangement, as on a wafer.

The units 106 may be part of a workpiece that was, for example, cut from a wafer, or the units 106 may be mounted to a carrier for processing, or to a PCB, package, or other structure. In the illustrated embodiment, the unit retainers 108 are disposed under the units 106, and one or more unit retainers may extend under, or be completely under, the units 106. Such an arrangement permits the unit retainers 108 to attract the cover and hold the cover onto the strip with units 106 to align the units 106.

Figure 2B:
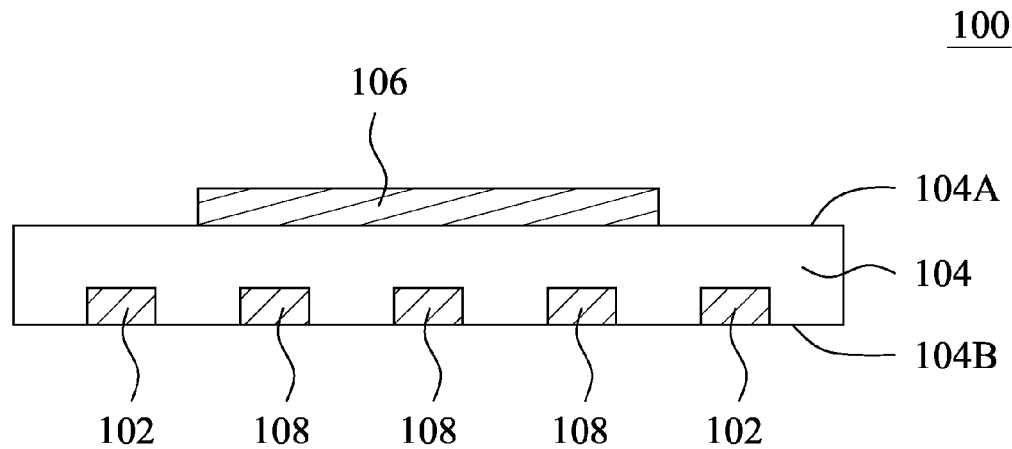

FIG. 2A is a top view of a boat 100 with strip-type unit retainers 108 according to some embodiments. FIG. 2B is a cross-sectional view of the boat 100 showing the strip-type unit retainers 108 in the base 104 according to some embodiments. In an embodiment, the boat 100 has unit retainers 108 that extend under multiple units 106. The unit retainers 108 have portions extending from under the units 106 past opposite edges of the units 106 so that a portion of the unit retainers 108 are uncovered by the units 106. Thus, in such an embodiment, a single unit retainer 108 has a surface exposed at opposing sides of a single unit 106. Additionally, the one unit retainer 108 as shown in FIG. 2A is not limited to extending under multiple units 106 in a single row, and may, in other embodiments, be under a single unit 106 and extend past the edges of that unit 106, or may extend under multiple units 106 in multiple rows. For example, a unit retainer 108 may extend under adjacent corners of four units 106 in a two-by-two or larger grid.

Figure 3A:
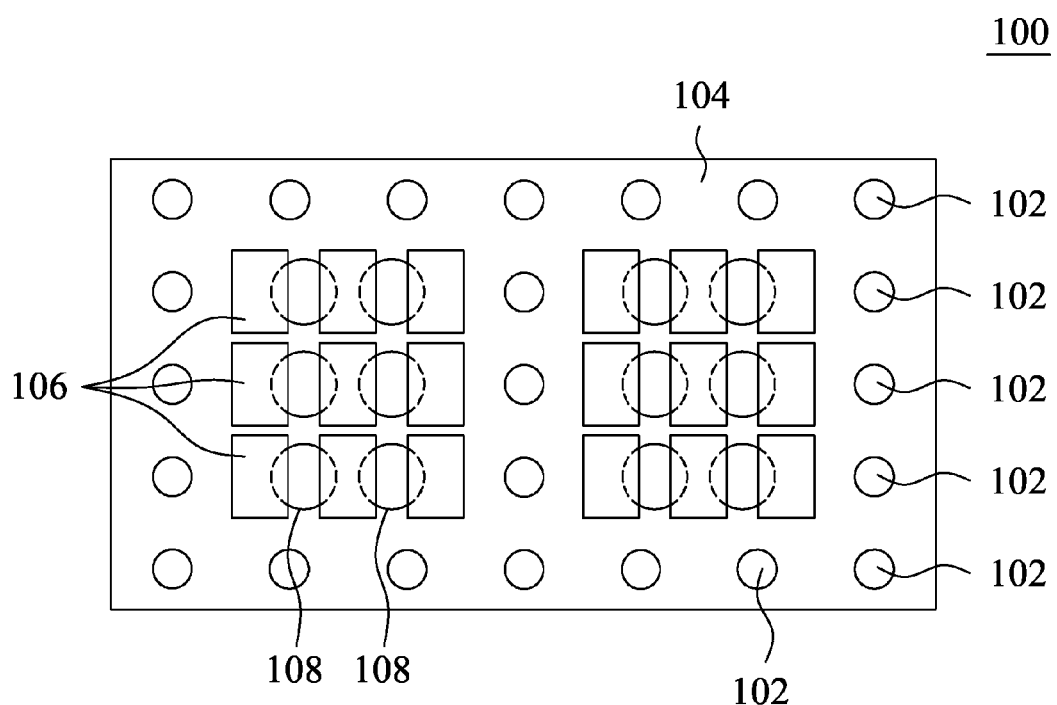
FIGS. 3A-3D are top views illustrating boats with alternative retainer arrangements according to some embodiments.

FIG. 3A is a top view illustrating a boat 100 with unit retainers 108 extending under two units 106 according to some embodiments. In such an embodiment, the units 106 are spaced apart and the unit retainer 108 extends between two adjacent units 106, with different portions of the unit retainer 108 under each of the units 106. A center portion of the unit retainer 108 is exposed between the adjacent units 106.

Figure 3B:
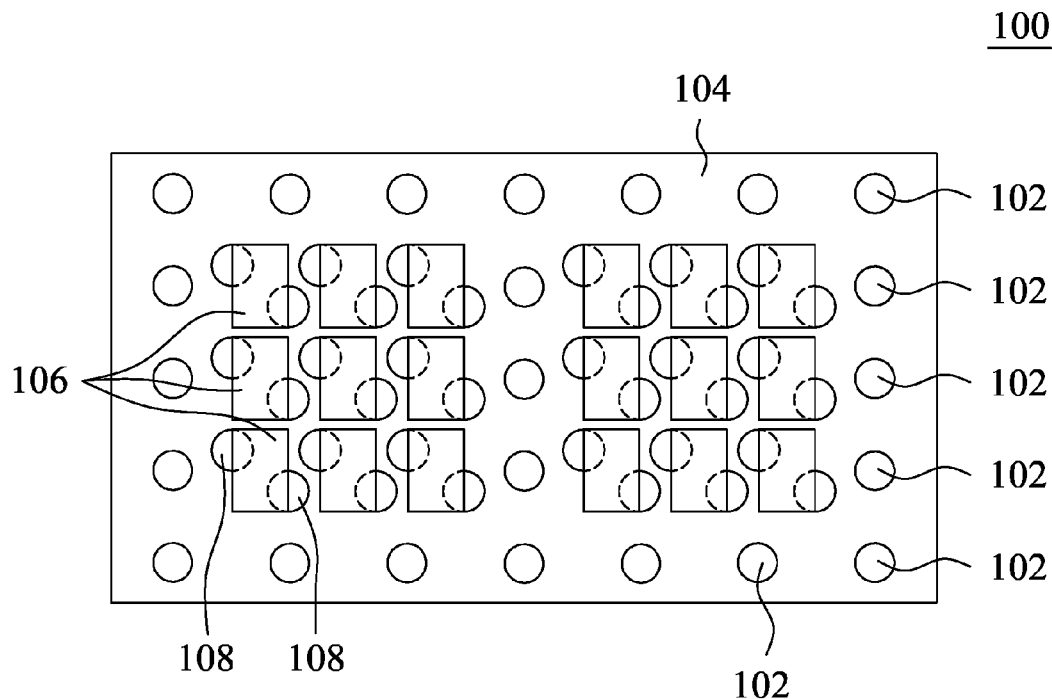

FIG. 3B is a top view diagram illustrating a boat 100 with units 106 having multiple unit retainers 108 in a unit area according to some embodiments. In such an embodiment, each unit 106 may have two or more unit retainers 108 extending thereunder. The unit retainers 108 may each extend under a single unit 106, or may extend under multiple units, as illustrated in FIG. 3A.

Figure 3C:
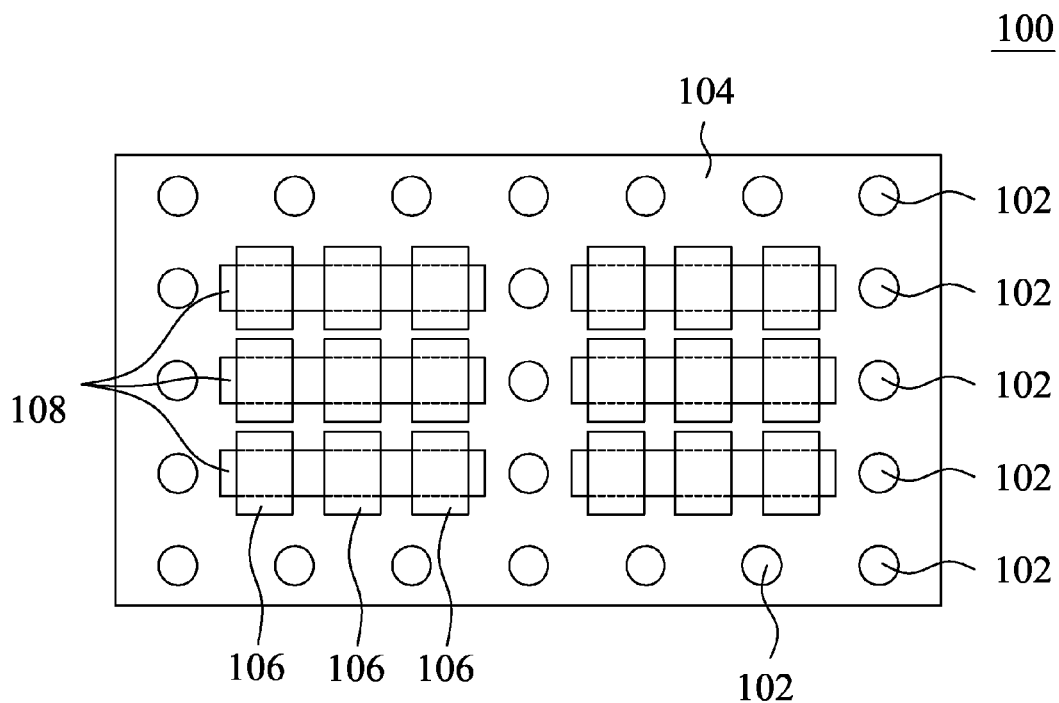

FIG. 3C is a top view of a boat 100 with strip-type unit retainers 108 according to some embodiments. In an embodiment, the boat 100 has unit retainers 108 that extend under multiple units 106. The unit retainers 108 have portions extending from under the units 106 past opposite edges of the units 106 so that a portion of the unit retainers 108 are uncovered by the units 106. Thus, in such an embodiment, a single unit retainer 108 has a surface exposed at opposing sides of a single unit 106 and extending under the unit 106. Additionally, the one unit retainer 108 as shown in FIG. 3C is not limited to extending under multiple units 106 in a single row, and may, in other embodiments, be under a single unit 106 and extend past the edges of that unit 106, or may extend under multiple units 106 in multiple rows. For example, a unit retainer 108 may extend under adjacent corners of four units 106 in a two-by-two or larger grid.

Figure 3D:
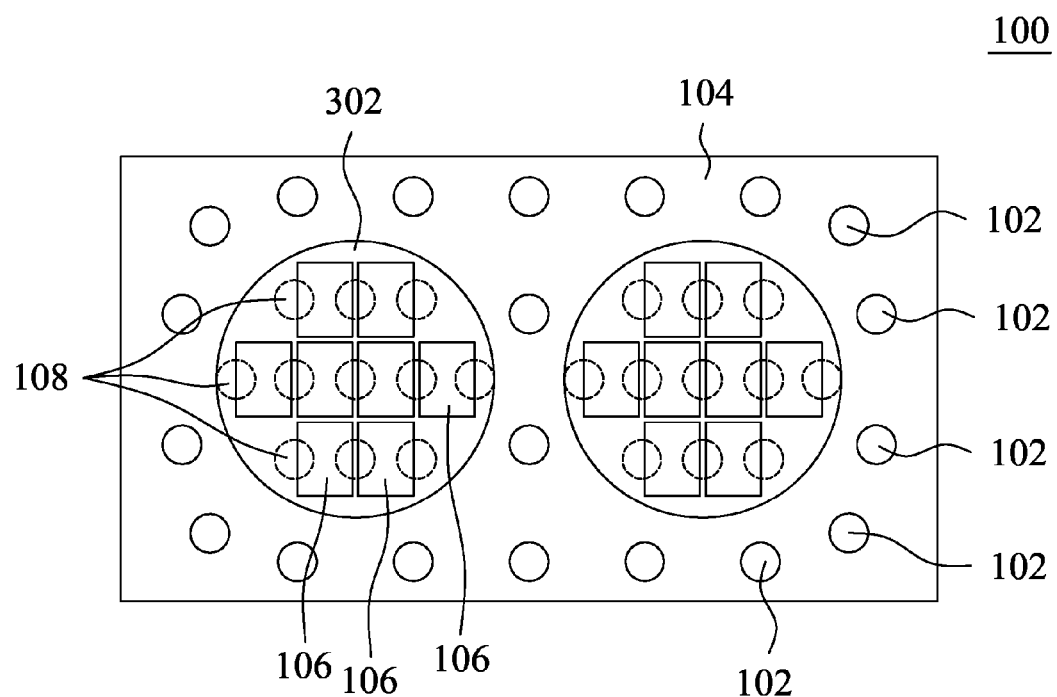

FIG. 3D is a top view diagram illustrating a boat 100 with units 106 disposed in grids on workpieces 302 according to some embodiments. In such an embodiment the units 106 are disposed in a one or two-dimensional array or grid on a workpiece 302. For example, the units 106 may be part of a wafer, or may be mounted on a carrier, package or the like as described above with respect to FIG. 3C. The unit retainer 108 may be covered by the workpiece 302, and may lie under one or more units 106.

In an embodiment, the cover is formed to have surfaces that abut the units 106 and align the individual units 106, and in other embodiments, the cover may have surfaces that abut the workpiece 302 to align the workpiece 302, with the assumption that the units 106 are properly aligned on the workpiece 302, and that aligning the workpiece 302 with the cover will align the units 106 also.

Figure 4:
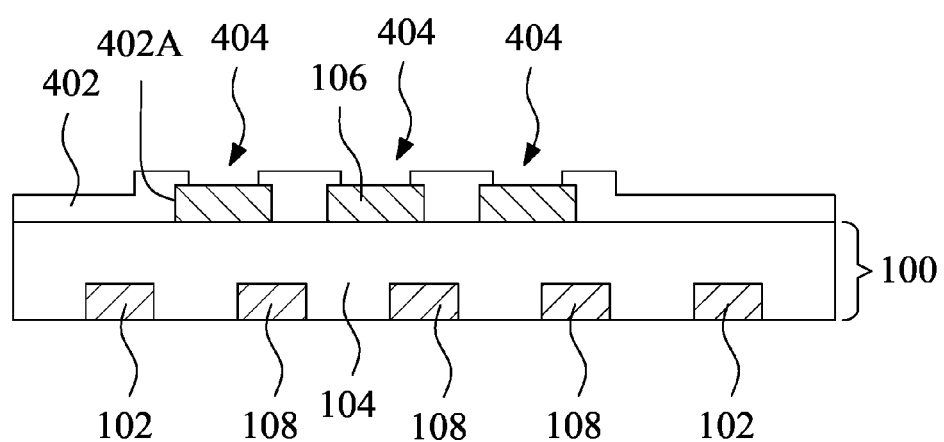
FIGS. 4 and 5A-5B illustrate cross-sectional views aligning units and mounting packages on the units using a cover and according to some embodiments.

FIG. 4 is a cross-sectional view illustrating placement of a cover 402 over the units 106 according to some embodiments. The cover 402 retains and aligns units 106. The cover has recesses in the bottom that accept the units 106. A cover sidewall 402A in the recess abuts the side of the unit 106 to hold the unit 106 in alignment, and a portion of the cover 402 overlies the unit 106 to maintain the unit 106 in contact with the boat 100. The unit retainer 108 clamps the cover 402 onto the units 106, providing the clamping force that keeps the cover 402 against the top surface of the boat 100. In an embodiment, one or more alignment pins (not shown here for clarity) may be disposed in the top surface of the boat 100, or in the bottom surface of the cover 402, with a corresponding opening in the opposing member, permitting accurate horizontal alignment of the cover 402 to the boat 100.

It has been discovered that having at least a portion of the unit retainers 108 exposed or extending past the edges of the units 106 gives superior cover 402 clamping force. Additionally, the unit retainer 108 underlying, or having no lateral spacing apart from the respective unit 106, provides clamping of the cover in the region directly abutting the units 106 and improves alignment and deformation control over the units 106 during processing. Thus, the unit retainers 108 are arranged so that they are immediately laterally adjacent to, or extend under, the units 106 when the units are aligned by the cover 402 when the cover 402 is attached to the boat 100.

In an embodiment where the unit retainers 108 are magnets, the magnets will be powerful enough to exert between about 450 gf (grams of force) and about 1000 gf on each unit. Additionally, in such an embodiment, the cover 402 is made from a ferromagnetic material such as iron, cobalt, steel, nickel, alloys of the same or other material that are attracted to a magnetic field. In some embodiments, the cover 402 is formed from a suitable material resistant to the processing environment and has ferromagnetic inserts that attach to the unit retainers 108 and border retainers 102 to align and clamp the cover 402 to the boat 100. Thus, the cover 402 is attached to the boat 100 by the interactions of the magnets forming the unit retainers 108 and the material of the cover 402.

Furthermore, while the cover 402 is shown contacting the top surface of the boat 100 and the unit retainers 108, the cover 402 is not necessarily limited to such an embodiment. In an embodiment, the cover 402 may have a portion contacting and retaining the units 106, and may not extend all the way to the surface of the boat 100. In such an embodiment, retainer pins may align the cover 402 with the boat 100, and the cover 402 may be spaced apart from the top surface of the boat 100 while unit retainers 108 attract and attach the cover 402 to provide clamping force to the cover 402 and units 106. This embodiment may be where the unit retainers 108 are magnets, for example, or where the unit retainers 108 are clamps, latches, or the like. Additionally, the cover may be formed with recesses for a workpiece 302 so that units 106 on a carrier, wafer, strip or the like may be accurately clamped to the boat 100.

In some embodiments, the cover 402 has openings 404 over each of the units 106. The openings 404 extend from the top surface of the cover 402 to the recesses. The top surface of each unit 106 is exposed through the cover 402 permitting access to the units 106 while clamped, for example, to permit mounting of devices, packages, dies, or the like to the top surface of the units 106.

Figure 5A:
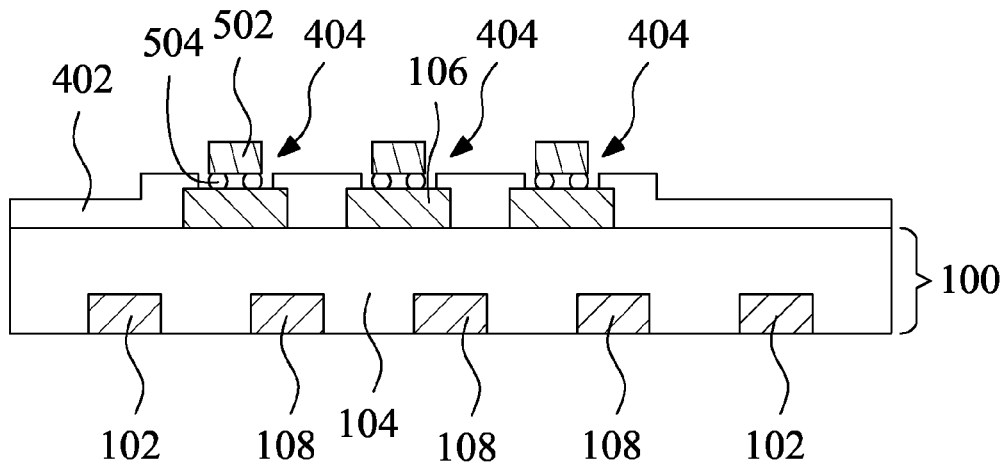

FIG. 5A is a cross-sectional view illustrating mounting of top packages 502 on clamped units 106 according to some embodiments. One or more top packages 502 are applied to each of the units 106 through the openings 404 in the cover 402. Connectors 504 are brought into contact with the units 106, and the connectors 504 are affixed to the units 106. In an embodiment, the connectors 504 are solder balls, solder bumps or the like, and the connectors 504 are activated or affixed to the units by heating the processing environment and the connectors 504 above the melting point of the connector solder material to reflow the solder. The cover 402 retains the units 106 against the surface of the boat 100 and in the unit areas during reflow. This prevents the units 106 from shifting out of the unit areas and becoming misaligned with the top packages 502 due to warping or shifting of the units 106 due to the heat of the reflow process.

Figure 5B:
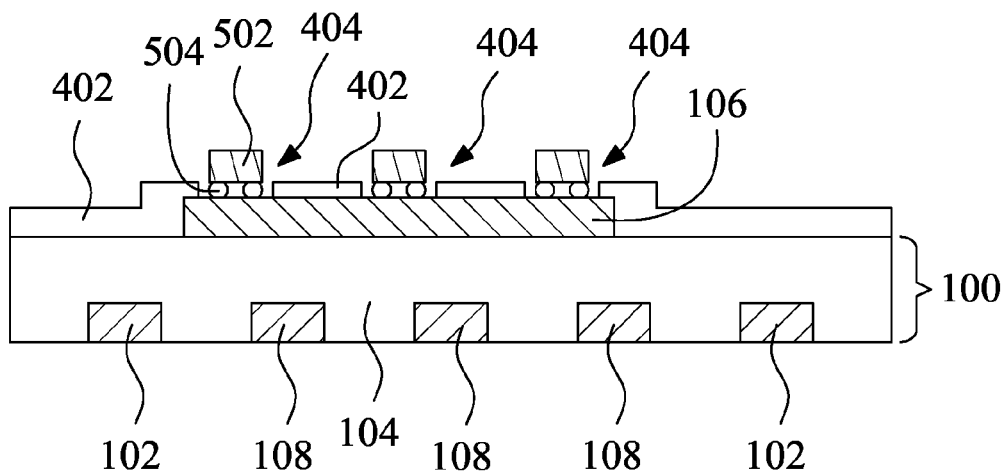

FIG. 5B is a cross-sectional view illustrating mounting multiple top package 502 to a unit 106 according to some embodiments. In such embodiments, the cover 402 has multiple openings 404 over a single unit, and one or top packages are mounted by way of connectors 504 to the unit. For example, a large unit 106 such as a processor or the like may have top packages 502 such as memory dies, communications dies, or other auxiliary packages mounted thereon. In an alternative embodiment, multiple units are disposed in a single workpiece, such as a wafer or on a carrier or the like. Each unit 106 on the workpiece will then have one or more openings 404 over the unit 106 through which the top packages 502 are mounted.

Figure 6A:
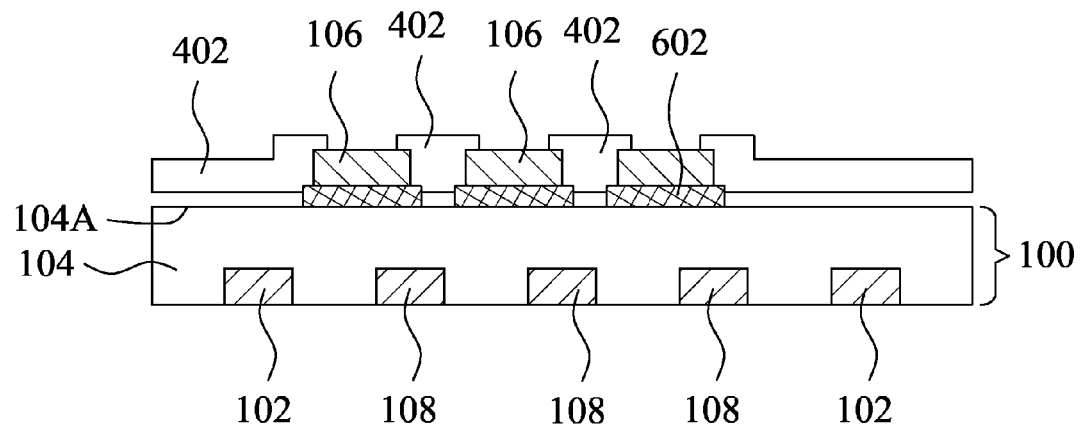
FIGS. 6A-6B illustrate cross-sectional views of boats with pressure sensors according to some embodiments.
Figure 6B:
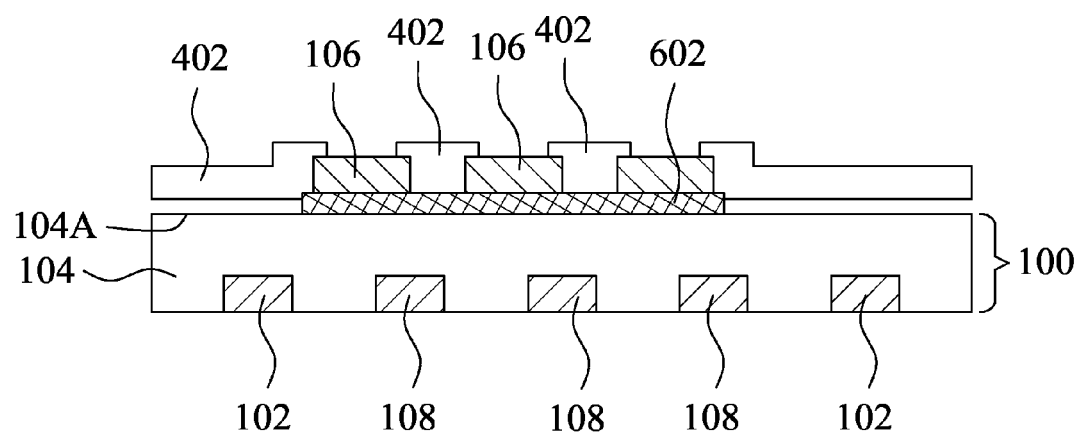

FIGS. 6A-6B illustrate cross-sectional views of boats 100 with pressure sensors according to some embodiments. The pressure sensors may have one or more pressure sensitive areas called sensels 602, where an individual pressure may be measured. Thus, a single sensor 602 may measure pressure in one or more regions on the sensor by reading the individual sensels 602. One or more sensels 602 are disposed in or on the base 104 and extend under the units 106. In an embodiment shown in FIG. 6A, each unit 106 is disposed over an individual sensor 602. In such an embodiment, the sensels read the pressure of a single unit 106 or of the cover 402 around a single unit 106. In another embodiment shown in FIG. 6B, units 106 are disposed over a single sensel 602. In such an embodiment, a single sensor with multiple sensels 602 may sense the pressure applied to each unit 106 or to the cover 402. In another embodiment, the sensor 602 may have a single pressure sensing sensel, and multiple units may be disposed over the single sensel 602, with the total pressure on all the units 106 or the pressure on the cover 402 as a whole measured by the sensor 602.

In an embodiment, the pressure sensor has one or more piezoelectric elements forming the individual sensels 602, with pressure on the sensel 602 indicated by a voltage value that is read by a sensor reading computer system. In other embodiments, the sensel 602 may be another type of pressure sensing structure.

Figure 7:
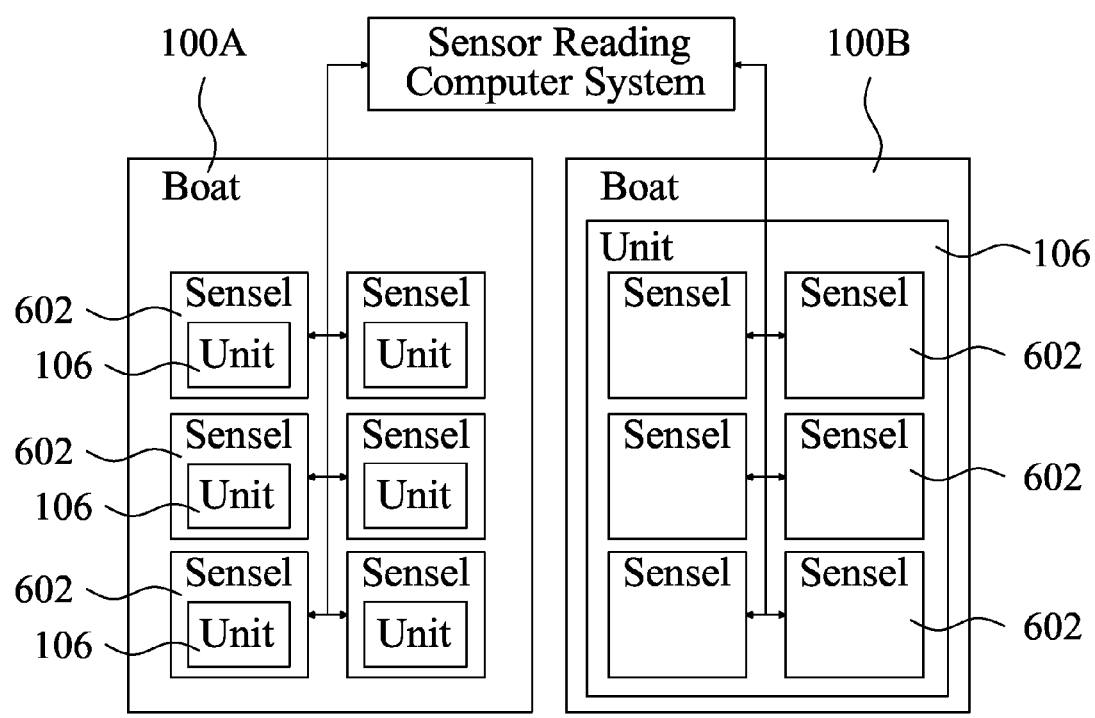
FIG. 7 illustrates a system for reading boat pressure sensors according to some embodiments.

FIG. 7 is a diagram illustrating a device processing system 700 for reading pressure sensors 602 on a boat 100A, 100B according to some embodiments. A sensor reading computer system 702 having a processor and nonvolatile memory has software stored on a nontangible medium, the software for reading the pressures indicated by pressure sensors on one or more boats 100A, 100B. In an embodiment, the sensor reading computer system 702 is connected to sensels 602 on a first boat 100A having multiple units 106 each disposed over an individual sensel 602. The sensor reading computer system 702 takes pressure readings before, during and after reflow to ensure that the pressure of each unit 106 on the boat does not fall outside a predetermined or optimal range. Thus, the individual sensels 602 measuring the pressure of the individual units 106 can determine if each individual unit 106 was maintained in a proper and accurate alignment during attachment of the top package 502 and reflow of the connector 504. In another embodiment, the sensor reading computer system 702 is connected to multiple sensels 602 disposed under a single unit 106. In such an embodiment, pressure readings from individual sensels 602 can determine if specific areas of a unit 106 were maintained in proper alignment during attachment of the top package 502 and reflow of the connectors 504. For example, readings from one or more sensels 602 that vary during reflow may indicate that the unit 106 warped during reflow. Additionally, in other embodiments, the sensor reading computer system 702 is connected to multiple boats 100 with different sensel arrangements.

Figure 8:
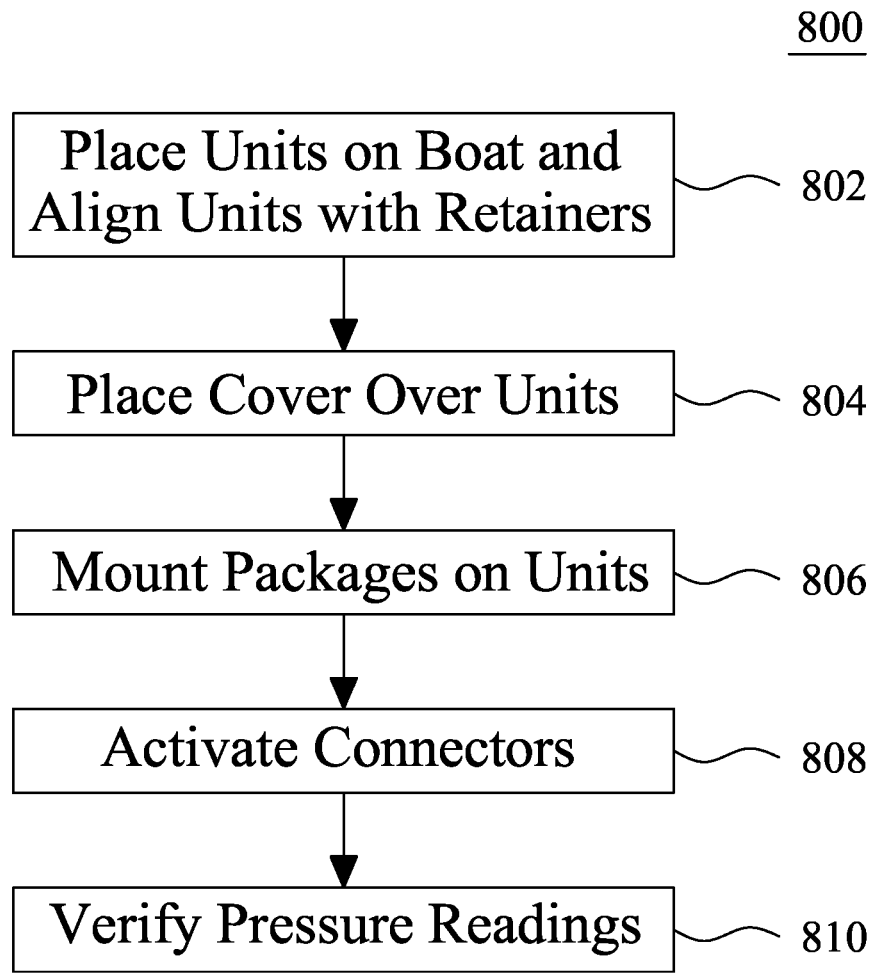
FIG. 8 is a flow diagram illustrating a method for mounting a package on a unit according to some embodiments.

FIG. 8 is a flow diagram illustrating a method 800 for mounting a package on a unit according to some embodiments. Initially, in block 802, units are placed on the boat and aligned with the unit retainers so that each unit covers a portion of a unit retainer, or directly abuts a region over a unit retainer. The cover is placed over the units in block 804, with the cover being retained by the border retainers and unit retainers. The units are held in place on the boat by the cover. Packages are mounted on the units in block 806, and the connectors connecting the package to the units are activated, for example by reflowing solder material of the connectors. Pressure readings are taken in block 808 either before, during or after activating the connectors, or multiple pressure readings are taken at combination of the aforementioned periods. The pressure readings are verified in block 810.

A device according to embodiments comprises a device processing boat comprising a base and at least one unit retainer disposed in the base. The device further comprises a cover having at least one recess configured to accept and retain at least one unit, the at least one recess aligned over, and configured to hold the at least one unit over, at least a portion of the at least one unit retainer. The cover is retained to the device processing boat by the at least one unit retainer. The at least one unit retainer is a magnet, and the cover has at least one cover portion formed from a material that is attracted to a magnetic field, the at least one cover portion corresponding to at least a portion of the at least one unit retainer. A plurality of border retainers is disposed in the base, and the cover is configured to align over and be retained by the plurality of border retainers. In an embodiment, the at least one recess comprises two or more recesses and wherein the at least one unit retainer extends under at least two of the two or more recesses. In an embodiment, the at least one unit retainer comprises two or more unit retainers, and wherein at least two of the two or more unit retainers extend under a same one of the two or more recesses. The cover has an opening over each of the recesses. At least one pressure sensor having at least one sensel is disposed in the base and having the sensel configured to sense a clamping force applied by the cover to the at least one unit. At least one pressure sensor comprises a plurality of sensels, and the at least one unit comprises a plurality of units. Each of the plurality of sensels is configured to sense the clamping force applied by the cover to a respective one of the plurality of units.

A device processing system according to embodiments comprises at least one device processing boat, comprising a base and at least one unit retainer disposed in the base and having a portion immediately adjacent to a unit area. At least one pressure sensor is disposed in the base and has at least one sensel extending into the unit area, the at least one sensel configured to measure a pressure in the unit area and generate a pressure reading. A sensor reading computer system is electrically connected to the at least one sensel and configured to read a pressure reading from the at least one sensel. The system further comprises at least one cover having at least one recess disposed in a first side of the at least one cover and configured to accept and retain at least one unit over the at least one unit area. The cover is configured to hold the at least one unit immediately laterally adjacent to at least a portion of a respective at least one unit retainer and over a portion of the at least one sensel. The cover is retained to the device processing boat by the at least one unit retainer. In an embodiment, the at least one boat comprises two or more boats, and each of the two or more boats has two or more sensels disposed therein, and the sensor reading computer system is connected to each of the two or more sensels on each of the two or more boats and is configured to read a separate pressure reading from each of the at least two sensels on each of the two or more two boats. In an embodiment, the at least one unit retainer is a magnet, and the cover has at least one cover portion formed from a material that is attracted to a magnetic field. The at least one cover portion corresponds to at least a portion of the at least one unit retainer. The magnet of the at least one unit retainer is configured to clamp the at least one unit with a clamping force between about 450 grams of force and about 1000 grams of force. The device processing boat further comprises a plurality of border retainers disposed in the base and outside of the unit area. The unit retainers are disposed in an interior region of the border retainers, and the cover is configured to align over and be retained by the plurality of border retainers. In an embodiment, the at least one recess comprises two or more recesses and the at least one unit retainer extends under at least two of the two or more recesses. In an embodiment, the at least one unit retainer comprises two or more unit retainers, and wherein at least two of the two or more unit retainers extend under a same one of the two or more recesses. The cover has an opening over the at least one recess and extending from a second side of the cover to the at least one recess.

A method of processing a device according to an embodiment comprises providing at least one unit in a corresponding at least one unit area on a top surface of a boat, the boat having at least one unit retainer immediately laterally adjacent to the at least one unit area, and providing a cover over the at least one unit, the cover having at least one recess in a bottom surface of the cover and at least one opening over the at least one recess, the at least one unit extending into the at least one recess, the cover retained to the top surface of the boat by the at least one unit retainer, the cover clamping the at least one unit to the top surface of the boat. The method further comprises mounting at least one top package on the at least one unit by a connector and through the opening, and activating the connector and affixing the top package to the unit. In an embodiment the unit retainer is a magnet, and the cover has a cover portion that is a ferromagnetic material, and the providing the cover comprises attaching the cover to the boat using a magnetic interaction between the at least one unit retainer and the cover portion. The providing the at least one unit further comprises aligning the at least one unit over at least one sensel disposed in the boat and extending under the unit area, and the method further comprises measuring a clamping pressure at the sensel with a sensor reading computer system. In an embodiment, the cover clamps the at least one unit to the boat with a clamping force between about 450 grams of force and about 1000 grams of force.

In a representative embodiment, a device processing system includes at least one device processing boat comprising: a base; at least one unit retainer disposed in the base and having a portion immediately adjacent to a unit area; at least one pressure sensor disposed on the base and having at least one sensel extending into the unit area, the at least one sensel configured to measure a pressure in the unit area and generate a pressure reading; and a sensor reading computer system electrically connected to the at least one sensel and configured to read a pressure reading from the at least one sensel. The at least one device processing boat may comprise two or more boats, with each of the two or more boats having at least two sensels disposed therein. The sensor reading computer system may be connected to each of the at least two sensels on each of the two or more boats. The sensor reading computer system may be configured to read separate pressure readings from each of the at least two sensels on each of the two or more boats. At least one cover may have at least one recess disposed in a first side of the cover and may be configured to accept and retain at least one unit over the unit area, and may be configured to hold the at least one unit immediately laterally adjacent to at least a portion of a respective at least one unit retainer and over a portion of the at least one sensel. The cover may be retained to the device processing boat by the at least one unit retainer. The at least one unit retainer may be a magnet, wherein the cover has at least one cover portion formed from a material that is attracted to a magnetic field. The at least one cover portion may correspond to at least a portion of the at least one unit retainer and the magnet of the at least one unit retainer may be configured to clamp the at least one unit with a clamping force between about 450 grams of force and about 1000 grams of force. The device processing boat may further comprise a plurality of border retainers disposed in the base and outside of the unit area, wherein the unit retainers may be disposed in an interior region of the border retainers, and the cover may be configured to align over and be retained by the plurality of border retainers. The cover may have an opening over the at least one recess and extending from a second side of the cover to the at least one recess. The at least one recess may comprise two or more recesses, and the at least one unit retainer may extend under at least two of the two or more recesses. The at least one unit retainer may comprise two or more unit retainers, and at least two of the two or more unit retainers may extend under a same one of the two or more recesses.

In another representative embodiment, a device processing system includes at least one device processing boat comprising: a base; at least one unit retainer disposed in the base and having a portion immediately adjacent to a unit area; at least one pressure sensor disposed on the base and having at least one sensel extending into the unit area (the at least one sensel configured to measure a pressure in the unit area and generate a pressure reading); and at least one cover having at least one recess disposed in a first side of the at least one cover and configured to accept and retain at least one unit over the unit area, and configured to hold the at least one unit immediately laterally adjacent to at least a portion of a respective at least one unit retainer and over a portion of the at least one sensel. The device processing system may further comprise a sensor reading computer system electrically connected to the at least one sensel and may be configured to read a pressure reading from the at least one sensel. The at least one device processing boat may comprise two or more boats, and wherein each of the two or more boats may have at least two sensels disposed therein, wherein the sensor reading computer system may be connected to each of the at least two sensels on each of the two or more boats and the sensor reading computer system may be configured to read a separate pressure reading from each of the at least two sensels on each of the two or more boats. The cover may be retained to the device processing boat by the at least one unit retainer having a surface substantially level with a surface of a first portion of the at least one unit retainer. The at least one unit retainer may be a magnet, and the cover may have at least one cover portion formed from a material that is attracted to a magnetic field, wherein the at least one cover portion corresponds to at least a portion of the at least one unit retainer and wherein the magnet of the at least one unit retainer is configured to clamp the at least one unit with a clamping force between about 450 grams of force and about 1000 grams of force. The device processing boat may further comprise a plurality of border retainers disposed in the base and outside of the unit area, wherein the unit retainers may be disposed in an interior region of the border retainers, and wherein the cover may be configured to align over and be retained by the plurality of border retainers. The cover may have an opening over the at least one recess and extending from a second side of the cover to the at least one recess. The at least one recess may comprise two or more recesses, wherein the at least one unit retainer extends under at least two of the two or more recesses. The at least one unit retainer may comprise two or more unit retainers, wherein at least two of the two or more unit retainers extend under a same one of the two or more recesses.

In yet another representative embodiment, a method of processing a device comprises: providing at least one unit in a corresponding at least one unit area on a top surface of a boat, the boat having at least one unit retainer immediately laterally adjacent to the corresponding at least one unit area; providing a cover over the at least one unit, the cover having at least one recess in a bottom surface of the cover and at least one opening over the at least one recess, the at least one unit extending into the at least one recess, the cover retained to the top surface of the boat by the at least one unit retainer, the cover clamping the at least one unit to the top surface of the boat; mounting at least one top package on the at least one unit by a connector and through the at least one opening; and activating the connector and affixing the top package to the unit. The step of providing the cover may further comprise: the unit retainer comprising a magnet; a cover portion of the cover comprising a ferromagnetic material; and attaching the cover to the boat using a magnetic interaction between the at least one unit retainer and the cover portion. The step of providing the at least one unit may further comprise aligning the at least one unit over at least one sensel disposed in the boat and extending under the unit area. The method may further comprise measuring a clamping pressure at the sensel with a sensor reading computer system. The step of providing the cover may comprise the cover clamping the at least one unit to the boat with a clamping force between about 450 grams of force and about 1000 grams of force.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device processing system comprising:
   at least one device processing boat comprising:
      a base;
      at least one unit retainer disposed in the base and having a portion immediately adjacent to a unit area; and
      at least one pressure sensor disposed on the base and having at least one sensel extending into the unit area, the at least one sensel configured to measure a pressure in the unit area and generate a pressure reading; and
   a sensor reading computer system electrically connected to the at least one sensel and configured to read a pressure reading from the at least one sensel.

2. The device processing system of claim 1, wherein the at least one device processing boat comprises two or more boats, and wherein each of the two or more boats has at least two sensels disposed therein, and wherein the sensor reading computer system is connected to each of the at least two sensels on each of the two or more boats and wherein the sensor reading computer system is configured to read a separate pressure reading from each of the at least two sensels on each of the two or more boats.

3. The device processing system of claim 1, further comprising:
   at least one cover having at least one recess disposed in a first side of the at least one cover and configured to accept and retain at least one unit over the unit area, and configured to hold the at least one unit immediately laterally adjacent to at least a portion of a respective at least one unit retainer and over a portion of the at least one sensel; and
   wherein the cover is retained to the device processing boat by the at least one unit retainer.

4. The device processing system of claim 3, wherein the at least one unit retainer is a magnet, and wherein the cover has at least one cover portion formed from a material that is attracted to a magnetic field, the at least one cover portion corresponding to at least a portion of the at least one unit retainer and wherein the magnet of the at least one unit retainer is configured to clamp the at least one unit with a clamping force between about 450 grams of force and about 1000 grams of force.

5. The device processing system of claim 3, wherein the device processing boat further comprises a plurality of border retainers disposed in the base and outside of the unit area, wherein the at least one unit retainer is disposed in an interior region of the border retainers, and wherein the cover is configured to align over and be retained by the plurality of border retainers.

6. The device processing system of claim 3, wherein the cover has an opening over the at least one recess and extending from a second side of the cover to the at least one recess.

7. The device processing system of claim 3, wherein the at least one recess comprises two or more recesses and wherein the at least one unit retainer extends under at least two of the two or more recesses.

8. The device processing system of claim 7, wherein the at least one unit retainer comprises two or more unit retainers, and wherein at least two of the two or more unit retainers extend under a same one of the two or more recesses.

9. A device processing system comprising:
   at least one device processing boat comprising:
      a base;
      at least one unit retainer disposed in the base and having a portion immediately adjacent to a unit area;
      at least one pressure sensor disposed on the base and having at least one sensel extending into the unit area, the at least one sensel configured to measure a pressure in the unit area and generate a pressure reading; and
   at least one cover having at least one recess disposed in a first side of the at least one cover and configured to accept and retain at least one unit over the unit area, and configured to hold the at least one unit immediately laterally adjacent to at least a portion of a respective at least one unit retainer and over a portion of the at least one sensel.

10. The device processing system of claim 9, further comprising:
    a sensor reading computer system electrically connected to the at least one sensel and configured to read a pressure reading from the at least one sensel.

11. The device processing system of claim 10, wherein the at least one device processing boat comprises two or more boats, and wherein each of the two or more boats has at least two sensels disposed therein, and wherein the sensor reading computer system is connected to each of the at least two sensels on each of the two or more boats and wherein the sensor reading computer system is configured to read a separate pressure reading from each of the at least two sensels on each of the two or more boats.

12. The device processing system of claim 10, wherein the cover is retained to the device processing boat by the at least one unit retainer having a surface substantially level with a surface of the device processing boat.

13. The device processing system of claim 12, wherein the at least one unit retainer is a magnet, and wherein the cover has at least one cover portion formed from a material that is attracted to a magnetic field, the at least one cover portion corresponding to at least a portion of the at least one unit retainer and wherein the magnet of the at least one unit retainer is configured to clamp the at least one unit with a clamping force between about 450 grams of force and about 1000 grams of force.

14. The device processing system of claim 9, wherein the device processing boat further comprises a plurality of border retainers disposed in the base and outside of the unit area, wherein the at least one unit retainer is disposed in an interior region of the border retainers, and wherein the cover is configured to align over and be retained by the plurality of border retainers.

15. The device processing system of claim 9, wherein the cover has an opening over the at least one recess and extending from a second side of the cover to the at least one recess.

16. The device processing system of claim 9, wherein:
the at least one recess comprises two or more recesses and wherein the at least one unit retainer extends under at least two of the two or more recesses; and
the at least one unit retainer comprises two or more unit retainers, and wherein at least two of the two or more unit retainers extend under a same one of the two or more recesses.

17. A system for processing semiconductor units, the system comprising:
a device processing boat comprising:
a base;
a plurality of unit retainers on a first side of the base;
a plurality of sensels on a second side of the base opposing the first side, each of the plurality of sensels configured to measure a pressure exerted thereon; and
a cover attached to the second side of the base, the cover having a plurality of recesses extending from a first surface of the cover facing the base to a second surface of the cover facing away from the base, each of the plurality of recesses configured to hold a semiconductor unit over a respective one of the plurality of sensels.

18. The system of claim 17, wherein each of the plurality of unit retainers has a first portion directly under a respective one of the plurality of sensels, and has a second portion laterally adjacent to the respective one of the plurality of sensels.

19. The system of claim 17, wherein the cover comprises a plurality of openings in the second surface of the cover, each of the plurality of openings exposing a respective one of the plurality of recesses.

20. The system of claim 17, wherein the plurality of sensels are connected and extend continuously over the second side of the base, wherein the system further comprises a sensor coupled to the plurality of sensels, and wherein the sensor is configured to measure a total pressure exerted on the plurality of sensels.

* * * * *